(12) United States Patent
Guo

(10) Patent No.: US 10,448,526 B2
(45) Date of Patent: Oct. 15, 2019

(54) FIXING STRUCTURE AND DISPLAY DEVICE

(71) Applicants: BOE TECHNOLOGY GROUP CO., LTD., Beijing (CN); K-TRONICS (SUZHOU) TECHNOLOGY CO., LTD., Suzhou, Jiangsu (CN)

(72) Inventor: Junli Guo, Beijing (CN)

(73) Assignees: BOE TECHNOLOGY GROUP CO., LTD., Beijing (CN); K-TRONICS (SUZHOU) TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 15/540,805

(22) PCT Filed: May 18, 2016

(86) PCT No.: PCT/CN2016/082437
§ 371 (c)(1),
(2) Date: Jun. 29, 2017

(87) PCT Pub. No.: WO2017/143673
PCT Pub. Date: Aug. 31, 2017

(65) Prior Publication Data
US 2018/0092228 A1 Mar. 29, 2018

(30) Foreign Application Priority Data
Feb. 26, 2016 (CN) .......................... 2016 1 0110001

(51) Int. Cl.
*H05K 5/02* (2006.01)
*H05K 5/00* (2006.01)
(Continued)

(52) U.S. Cl.
CPC ..... *H05K 5/0217* (2013.01); *G02F 1/133308* (2013.01); *G06F 1/16* (2013.01);
(Continued)

(58) Field of Classification Search
CPC .......................... H05K 5/0217; H05K 5/0017
(Continued)

(56) References Cited

U.S. PATENT DOCUMENTS 8,437,120 B2 * 5/2013 Lee ...................... H05K 5/0217
361/679.01
8,477,257 B2 * 7/2013 Nakano ............. G02F 1/133308
349/58
(Continued)

FOREIGN PATENT DOCUMENTS

CN 203982035 U 12/2014
CN 204287658 U 4/2015
(Continued)

OTHER PUBLICATIONS

First Office Action for Chinese Patent Application No. 201610110001.0 dated Oct. 9, 2017.
(Continued)

*Primary Examiner* — Rockshana D Chowdhury
(74) *Attorney, Agent, or Firm* — Calfee, Halter & Griswold LLP

(57) ABSTRACT

A fixing structure and a display device including said fixing structure are provided. The fixing structure includes a front shell, a frame and a connecting piece. The front shell includes a front surface frame and a connecting frame, said connecting frame having a front shell slot penetrating the connecting frame formed thereon. The frame includes a bottom frame and a vertical side frame perpendicular to the bottom frame, said vertical side frame having a frame slot penetrating the vertical side frame formed thereon. The connecting piece includes an insertion section that can be fitted and inserted into the front shell slot and the frame slot sequentially.

14 Claims, 3 Drawing Sheets

(51) Int. Cl.
  *G02F 1/1333* (2006.01)
  *G06F 1/16* (2006.01)
  *H04N 5/64* (2006.01)

(52) U.S. Cl.
  CPC . *H05K 5/0017* (2013.01); *G02F 2001/13332* (2013.01); *G02F 2001/133317* (2013.01); *G02F 2201/465* (2013.01); *H04N 5/64* (2013.01)

(58) Field of Classification Search
  USPC .................................................... 361/679.21
  See application file for complete search history.

(56) References Cited

U.S. PATENT DOCUMENTS

| | | | | |
|---|---|---|---|---|
| 2009/0316341 | A1* | 12/2009 | Huang | G02F 1/133308 361/679.01 |
| 2010/0142178 | A1* | 6/2010 | Yee | H05K 5/0017 361/829 |
| 2013/0141856 | A1* | 6/2013 | Yu | G06F 1/1601 361/679.21 |
| 2013/0155717 | A1* | 6/2013 | Jeong | G02F 1/133308 362/602 |
| 2014/0362325 | A1* | 12/2014 | Lee | G02F 1/133308 349/58 |
| 2015/0072545 | A1* | 3/2015 | Kang | H01R 12/53 439/83 |
| 2015/0181732 | A1* | 6/2015 | Fujikawa | H04N 5/64 361/679.01 |

FOREIGN PATENT DOCUMENTS

| | | |
|---|---|---|
| CN | 204479865 U | 7/2015 |
| CN | 204650929 U | 9/2015 |
| CN | 205016152 U | 2/2016 |
| CN | 105528961 A | 4/2016 |
| CN | 205354538 U | 6/2016 |
| KR | 20150102617 A | 9/2015 |

OTHER PUBLICATIONS

Search Report for International Application No. PCT/CN2016/082437 dated Nov. 8, 2016.

* cited by examiner

FIXING STRUCTURE AND DISPLAY DEVICE

RELATED APPLICATION

The present application is the U.S. national phase entry of PCT/CN2016/082437, with an international filing date of May 18, 2016, which claims the benefit of Chinese Patent Application No. 201610110001.0, filed on Feb. 26, 2016, the entire disclosure of which is incorporated herein by reference.

TECHNICAL FIELD

The present disclosure relates to the technical field of display devices, in particular to a fixing structure and a display device comprising said fixing structure.

BACKGROUND

With the constant development of science and technology and the continuous improvement of people's living standard, products with display devices, such as televisions, computers, and etc., have become necessities of every family. Besides, as new models of various products are emerging on the market, users will not only choose a product because of its performance, but also consider factors like the price, appearance (size, aesthetics, etc.) and weight. Generally speaking, for products with the same performance, users may prefer those with cheaper prices and better appearance.

SUMMARY

An embodiment of the present disclosure provides a fixing structure and a display device comprising said fixing structure, said display device has a front shell which has a narrow front surface frame, so it can be easily assembled and disassembled and has a low manufacturing cost.

An embodiment of the present disclosure provides a fixing structure, comprising:

a front shell including a front surface frame and a connecting frame perpendicular to said front surface frame, wherein said connecting frame having a front shell slot penetrating the connecting frame formed thereon, and further having a first clamping structure provided thereon;

a frame including a bottom frame and a vertical side frame perpendicular to the bottom frame, wherein said vertical side frame having a frame slot penetrating the vertical side frame formed thereon and further having a second clamping structure provided thereon, said vertical side frame of the frame is arranged facing the connecting frame of the front shell, said front shell slot corresponds to said frame slot in position, and said first clamping structure fits and clamps with said second clamping structure;

a connector including an insertion section that is configured to be fitted and inserted into the front shell slot and the frame slot sequentially.

When assembling said fixing structure, first the frame slot on the frame is aligned with the front shell slot on the front shell, and the first clamping structure fits and clamps with the second clamping structure, so that the front shell and the frame cannot dislocate relatively along a circumferential direction of the display device. Insertion sections of the connector can be sequentially inserted into said front shell slots and frame slots, so that the front shell and the frame cannot dislocate relatively along a circumferential direction of the display device.

In one embodiment, a plurality of said front shell slots are formed on the connecting frame, and a plurality of said frame slots are formed on the vertical side frame, said plurality of front shell slots corresponding to said plurality of frame slots in a one-to-one manner, and there are a plurality of said connectors, which are respectively inserted into said corresponding front shell slots and frame slots in a one-to-one manner.

In one embodiment, each of the connectors includes two insertion sections.

In one embodiment, a limiting rib is provided between two adjacent front shell slots on the connecting frame, and a recess is provided between two insertion sections of the connector, when said insertion section is inserted into the front shell slot and the frame slot, the limiting rib is located within the recess and in touch with an inner wall of the recess.

In one embodiment, each of the connectors includes a fixing section, on which a mounting hole is formed, and a fastener that can be fitted and connected to the mounting hole is provided on a back plate of the display device.

In one embodiment, the fixing section abuts on an end face of the connecting fame near the back plate, and abuts on an end face of the vertical side frame near the back plate.

In one embodiment, a sinking groove is formed on both the end face of the connecting fame near the back plate and the end face of the vertical side frame near the back plate, and the fixing section is located in the sinking slot.

In one embodiment, the fixing section and the insertion section are integrated into one piece.

In one embodiment, the connector is made by bending a plate.

In one embodiment, the connector is made of a progressive mold.

An embodiment of the present disclosure further provides a display device, which comprises the above-mentioned fixing structure.

When assembling the front shell and the frame of the display device, it is only needed to fit and clamp the first clamping structure with the second clamping structure, and insert the connector into the aligned front shell slot and frame slot, and then connection of the front shell and the frame can be realized. When repairing, it is only needed to extract the connector and separate the first clamping structure from the second clamping structure; then the front shell can be separated from the frame. Therefore, the fixing structure and the display device comprising the fixing structure as provided in embodiments of the present disclosure can be assembled and disassembled more conveniently, quickly and efficiently than those in the prior art. Besides, it is unnecessary to arrange any boss column on the front shell, so the width of the front surface frame of the front shell is reduced and the product looks better; moreover, the connector has a simple structure and is small in size, and it can be manufactured without mold, so the manufacturing cost is reduced.

BRIEF DESCRIPTION OF THE DRAWINGS

To further clarify the technical solutions in the embodiments of the present disclosure or in the prior art, drawings that are to be used for depiction of the embodiments or the prior art will be briefly introduced below. Apparently, said drawings are merely some of the embodiments of the present

DETAILED DESCRIPTION

Figure 1:
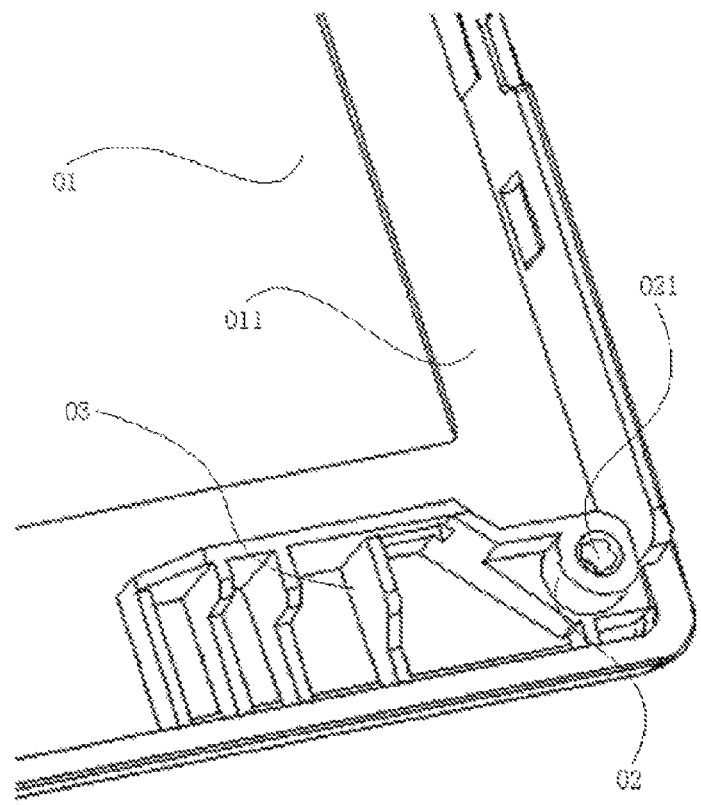
FIG. 1 is a structural diagram of a front shell of a fixing device provided in the prior art.

Technical solutions in the embodiments of the present disclosure will be now described clearly and completely with reference to the drawings in the embodiments of the present disclosure. Obviously, the described embodiments are only some, instead of all, of the embodiments. All other embodiments that can be obtained by those ordinarily skilled in the art on the basis of the embodiments in the present disclosure without using any inventive skill shall fall into the protection scope of the present disclosure.

It shall be understood that in the descriptions of the present disclosure, the directional or positional relationships indicated by terms like "center", "on" "under", "front", "behind", "left", "right", "vertical", "horizontal", "top", "bottom", "interior", "exterior" and the like are directional or positional relationships as shown in the drawings, and said terms are merely used for facilitating and simplifying description of the disclosure, but do not intend to mean or suggest that the indicated device or element must have a specific direction or be constructed and operated in a specific direction, so they shall not be considered as limiting the present disclosure.

In the descriptions of the present disclosure, it shall be noted that the terms "mount", "link" "connect" should be interpreted in a broad sense unless otherwise defined and specified explicitly, for example, a "connection" can be a fixed connection, a detachable connection or an integral connection; it can be a mechanical connection; it can be a direct connection or an indirect connection via intermediate medium or an internal linkage between two elements. Those ordinarily skilled in the art can understand the specific meanings of said terms in the present disclosure according to the specific situation.

A display device is a device for displaying signals received by a product in the form of images through a display screen. For example, the display device in a television is a device for displaying video signals separated by electronic circuits of the television as images through a display screen.

As shown in FIG. 1, a fixing structure is provided in an existing display device for supporting the main display part. Said fixing structure comprises a front shell 01 and a frame (not shown in the figure) arranged opposing to the front shell 01, and a boss column (raised column) 02 is disposed on a side of the front shell 01 near the frame. When assembling the front shell 01 and the frame, a bolt passes through a via hole on the frame and is screwed into a threaded hole 021 of the boss column 02. Such way of connection requires assemblers to screw the bolt into the boss column 02 so as to fix the front shell 01 to the frame, but it is inconvenient to disassemble and assemble for repairing, and the assembling process is time-consuming and inefficient. Meanwhile, the boss column 02 has a diameter of at least 5 mm, plus the size of a rib 03 as the safety margin, so a front surface frame 011 of the front shell 01 of the display device has a width of at least over 9 mm, which affects the pleasing appearance of the final product. Moreover, when manufacturing the boss column 02, a mold needs to be produced by an engineering mold before mass production, so the manufacturing cost is high, which raises the manufacturing cost for the display device to some extent.

Figure 2:
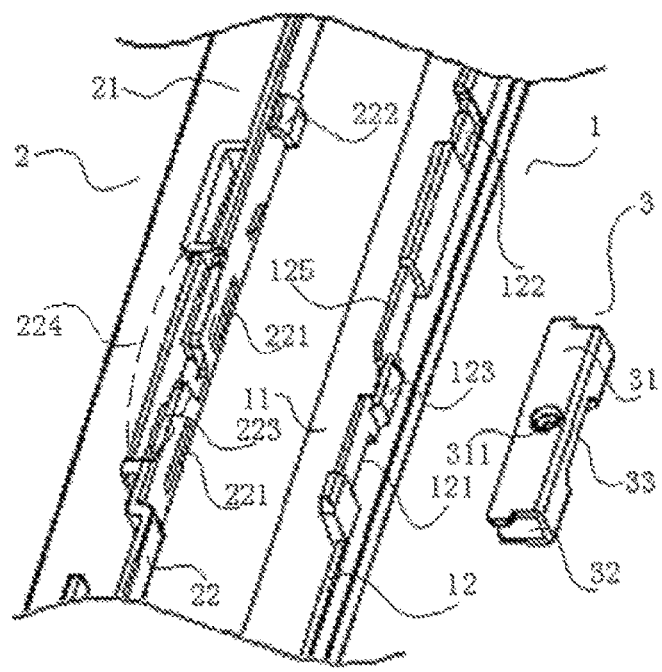
FIG. 2 is a local assembly drawing of a fixing structure provided by an embodiment of the present disclosure.

An embodiment of the present disclosure provides a fixing structure for fixing a front shell and a frame of a display device. As shown in FIG. 2, said fixing structure comprises a front shell 1, a frame 2 and a connector 3. The front shell 1 comprises a front surface frame 11 and a connecting frame 12 perpendicular to said front surface frame, said connecting frame 12 having a front shell slot 121 penetrating the connecting frame formed thereon, and further having a first clamping structure 122 provided thereon. The frame 2 includes a bottom frame 21 and a vertical side frame 22 perpendicular to the bottom frame, said vertical side frame 22 having a frame slot 221 penetrating the vertical side frame 22 formed thereon and further having a second clamping structure 222 provided thereon. Said vertical side frame 22 of the frame 2 is arranged facing the connecting frame 12 of the front shell 1, and said front shell slot 121 corresponds to said frame slot 221 in position. Said first clamping structure 122 fits and clamps with said second clamping structure 222 so as to define relative positions of the front shell 1 and the frame 2 along a circumferential direction of the display device. A connector 3 comprises insertion sections 32, which can be sequentially inserted into said corresponding front shell slots 121 and frame slots 221 so as to define relative positions of the front shell 1 and the frame 2 along a circumferential direction of the display device.

The circumferential direction of the display device refers to a direction surrounding an outer side of the display device, and a direction perpendicular to the circumferential direction of the display device refers to an insertion direction of an insertion section 32. When assembling said fixing structure, first the frame slot 221 on the frame 2 is aligned with the front shell slot 121 on the front shell 1, and the first clamping structure 122 fits and clamps with the second clamping structure 222, so that the front shell 1 and the frame 2 cannot dislocate relatively along the circumferential direction of the display device. Then the insertion section 32 of the connector 3 is fitted and inserted into the front shell slot 121 and the frame slot 221 sequentially, so that the front shell 1 and the frame 2 cannot dislocate relatively along the circumferential direction of the display device.

When assembling the front shell 1 and the frame 2, it is only needed to fit and clamp the first clamping structure 122 with the second clamping structure 222, and insert the connector 3 into the aligned front shell slot 121 and frame slot 221, then connection of the front shell 1 and the frame 2 can be realized. When repairing, it is only needed to extract the connector 3 and separate the first clamping structure 122 from the second clamping structure 222; then the front shell 1 can be separated from the frame 2. Therefore, the fixing structure as provided in the embodiments of the present disclosure can be assembled and disassembled more conveniently, quickly and efficiently than those in the prior art. Besides, it is unnecessary to arrange any boss column on the front shell 1, so the width of the front surface frame 11 of the front shell 1 is reduced and the product looks better; moreover, the connector 3 has a simple structure and is small in size, and it can be manufactured without mold, so the manufacturing cost is reduced.

In order to ensure connection strength, as shown in FIG. 2, a plurality of front shell slots 121 are formed on the connecting frame 12, and a plurality of said frame slots 221 are formed on the vertical side frame 22, said plurality of front shell slots 121 corresponding to said plurality of frame slots 221 in a one-to-one manner. There are a plurality of said connectors 3, whose insertion sections 32 are respectively inserted into said corresponding front shell slots 121 and frame slots 221 in a one-to-one manner. The plurality of connectors 3 insert the front shell 1 and the frame 2 in their circumferential directions, so that the assembled fixing structure has high connection strength and no disconnection will occur in the connection positions, thus ensuring stability of the fixing structure in use.

Figure 3:
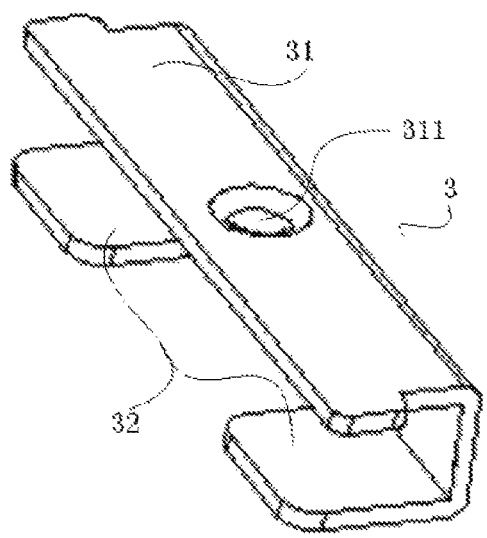
FIG. 3 shows a perspective of a connector of a fixing structure provided by an embodiment of the present disclosure.

As shown in FIG. 3, each connector 3 may include one fixing section 31 and two insertion sections 32 arranged on said fixing section. One fixing section 31 is arranged on each connector 3 to enable high connection strength without connection failure when said connector 3 is fixed to a back plate of the display device. There are a number of insertion sections 32 on the connector 3, and when the size of the connector 3 is fixed, each insertion section 32 has a small size. After being inserted into corresponding slots, the insertion sections 32 will not easily crack or break even if they have been subjected to a stress for a long time when being used. When there are two insertion sections 32, the strength of connection between the insertion sections 32 and the fixing section 31 is high, so that in the case of reducing damage to the insertion sections 32, disconnections between the fixing section 31 and the insertion section 32 will not occur during operation of the connector 3, thereby ensuring that it works properly.

In order to enable a quick positioning of the connector 3 during assembling, as shown in FIG. 2, a limiting rib 123 is provided between two adjacent front shell slots 122 on the connecting frame 12, and a recess 33 is provided between two insertion sections 32 of the connector 3. When said insertion section 32 is inserted into the corresponding front shell slot 121 and frame slot 221, the limiting rib 123 is located within the recess 33 and a surface of the limiting rib 123 facing away from the front surface frame 11 is in touch with an inner wall of the recess 33. When the insertion section 32 of the connector 3 is inserted into the front shell slot 121 and the frame slot 221, the surface of the limiting rib 123 on the connecting frame 12 facing away from the front surface frame 11 is in touch with an inner wall of the recess 33, thus facilitating assemblers to observe whether the insertion section 32 of the connector 3 has been fully inserted into the front shell slot 121 and the frame slot 221 and facilitating them to locate it. Meanwhile, the surface of the limiting rib 123 facing away from the front surface frame 11 in touch with the inner wall of the recess 33 can ensure that the connector 3 cannot shake along a direction perpendicular to the front surface frame 11, so that connection between the front shell 1 and the frame 2 is firmer.

In order to ensure strength of the connector 3, as shown in FIG. 3, the fixing section 31 and the insertion section 32 are integrated into one piece. After integrating the fixing section 31 and the insertion section 32 into one piece, no connecting section exists between them, so disconnection between the fixing section 31 and the insertion section 32 will not occur due to high stress and the proper working of the connector 3 is guaranteed.

In order to reduce the manufacturing cost of the connector 3 and to increase manufacturing efficiency of the connector 3, as shown in FIG. 3, the connector 3 is made by bending a plate. A plate is the most readily available finished product during manufacturing in a factory, the manufacturing technology thereof is mature and the manufacturing cost is low. Therefore, bending a plate to make the connector 3 can reduce the manufacturing cost of the connector 3. Besides, the plate has high machinability, and the manufacturing process of bending the plate to make the connector 3 is relatively less difficult, so fast manufacturing can be realized and the manufacturing efficiency of the connector 3 can be increased.

In order to further increase the manufacturing efficiency of the connector 3, the connector 3 is made of a progressive mold. The progressive mold consists of multiple stations, each performing a different processing; the stations are sequentially associated and perform a series of different punching processing during one stroke of a punching machine. The progressive mold has characteristics such as quick processing speed and requiring no feeding and moving of workpieces during processing. The connector 3 has a simple structure and is small in size, and the manufacturing process of bending a plate to make the connector 3 is simple, so fast and mass production can be realized using the progressive mold.

In order to ensure that the fixing structure will not dislocate owing to long-time use or other external forces, the connector 3 is connected to the back plate (not shown in the figure) of the display device. As shown in FIG. 3, a mounting hole 311 is formed on the fixing section 31, and a fastener (not shown in the figure) that can be fitted and connected to the mounting hole 311 is provided on the back plate of the display device. By fitting and connecting the fastener and the mounting hole 311, the assembled fixing structure is connected to the back plate of the display device, so that said fixing structure will not dislocate after being assembled to the display device. Moreover, such a way of connection is convenient and efficient and enables easy disassembly, so operations are simplified.

Specifically, the mounting hole 311 formed on the fixing section 31 can be a threaded hole, and then the fastener is a bolt, and by screwing the bolt into the threaded hole, the back plate of the display device is fixed to the connector 3.

Figure 5:
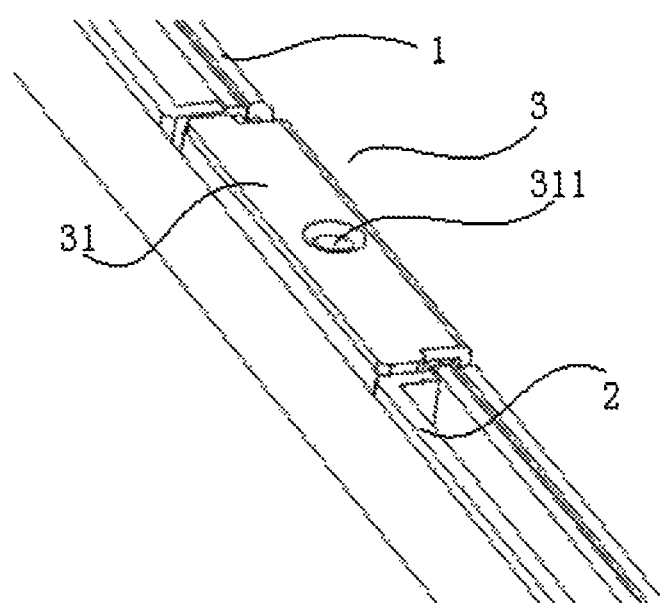
FIG. 5 is an assembly drawing of a connecting position of a fixing structure provided by an embodiment of the present disclosure.

In order to prevent the fixing section 31 from occupying extra space, as shown in FIGS. 2 and 5, the fixing section 31 abuts on an end face 125 of the connecting fame 12 near the back plate, and abuts on an end face 223 of the vertical side frame 22 near the back plate. Once the assembling is completed, the fixing section 31 abuts on an end face 125 of the connecting fame 12 near the back plate, and abuts on an end face 223 of the vertical side frame 22 near the back plate, thus no gap exists between the fixing section 31 and the connecting frame 12, as well as between the fixing section 31 and the vertical side frame 22. The connector 3 is thin, thus avoiding increase of the thickness of the fixing structure caused by the fixing section 31 occupying extra space, which influences the appearance of the final display device. Besides, the connector 3 with such a size can be easily positioned during assembling, and will not easily disconnect from the connection position after being assembled, so the fixing structure can be transported as one piece after being assembled, so that it can be directly used in the next-step assembling.

Figure 4:
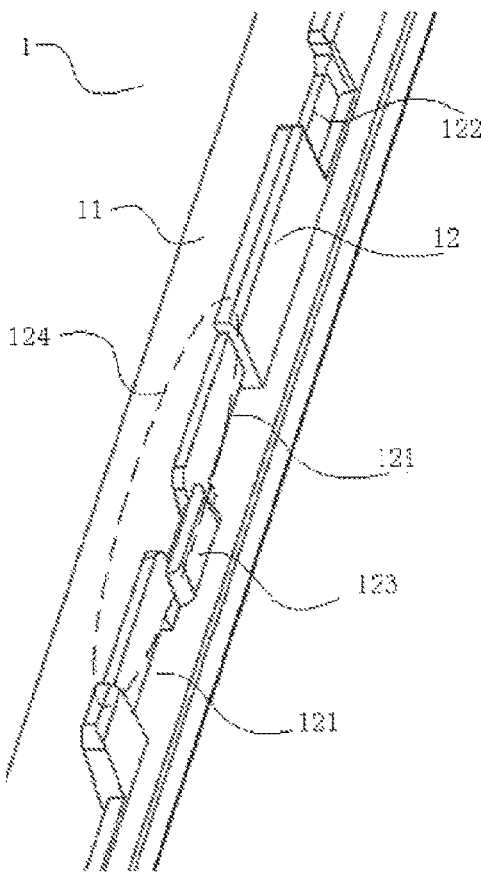
FIG. 4 shows a local perspective of a front shell of a fixing structure provided by an embodiment of the present disclosure.

In order to further reduce the thickness of the fixing structure after assembling and make the finally assembled product look better, as shown in FIGS. 2, 4 and 5, a sinking groove is formed on both the end face of the connecting frame 12 near the back plate and the end face of the vertical side frame 22 near the back plate, and the fixing section 31 is located in said sinking groove. A sinking groove 124 on the connecting frame 12 and a sinking groove 224 on the vertical side frame 22 together accommodate the fixing section 31. After assembling the fixing structure, the thickness of the connecting position only equals to the height of the connecting frame 12 or the vertical side frame 22, so that the finally assembled product has small thickness and suits users' aesthetic tastes.

An embodiment of the present disclosure further provides a display device, comprising the fixing structure described above. Said display device has a low manufacturing cost and can be conveniently and quickly assembled and disassembled during processes of assembling and repairing. Moreover, the front surface frame 11 of the front shell 1 of the display device is narrow, so the appearance of the display device is pleasing and suits users' aesthetic tastes.

The fixing structure used in the display device of the present embodiment is the same as the fixing structure provided in the above embodiments for the fixing structure, so they can solve the same technical problem and achieve the same expected effect.

As for other components of the display device of the embodiment of the present disclosure, they are well known to those skilled in the art, so they will not be detailed herein any more.

The above described are only specific embodiments of the present disclosure, which do not intend to limit the protection scope of the present disclosure. Any variation or substitution that is easily conceivable by those skilled in the art within the technical scope disclosed by the present disclosure shall fall into the protection scope of the present disclosure. Thus the protection scope of the present disclosure is defined by the protection scope of the appended claims.

What is claimed is:

1. A fixing structure, comprising:
   a front shell, including a front surface frame and a connecting frame perpendicular to said front surface frame, wherein said connecting frame having a front shell slot penetrating the connecting frame formed thereon, and further having a first clamping structure provided thereon;
   a frame, including a bottom frame and a vertical side frame perpendicular to the bottom frame, wherein said vertical side frame having a frame slot penetrating the vertical side frame formed thereon and further having a second clamping structure provided thereon, said vertical side frame of the frame is arranged facing the connecting frame of the front shell, said front shell slot corresponds to said frame slot in position, and said first clamping structure fits and clamps with said second clamping structure;
   a connector, including an insertion section that is configured to be fitted and inserted into the front shell slot and the frame slot sequentially in a direction parallel to the front surface frame and the bottom frame,
   wherein a plurality of said front shell slots are formed on the connecting frame, and a plurality of said frame slots are formed on the vertical side frame, said plurality of front shell slots corresponding to said plurality of frame slots in a one-to-one manner, and
   wherein a plurality of said insertion sections of a plurality of said connectors are respectively inserted into said corresponding front shell slots and frame slots in a one-to-one manner,
   wherein each of the plurality of said connectors comprises two of said insertion sections, and
   wherein a limiting rib that is facing away from the front surface frame is provided between two adjacent front shell slots of the plurality of said front shell slots on the connecting frame, and
   a recess is provided between the two of said insertion sections of the plurality of said connector,
   when said insertion section is inserted into the front shell slot and the frame slot, the limiting rib is located within the recess and in touch with an inner wall of the recess.

2. The fixing structure according to claim 1, wherein each of the plurality of said connectors includes a fixing section, a mounting hole is formed on the fixing section, and a fastener for fitting and connecting to the mounting hole is provided on a back plate of the display device.

3. The fixing structure according to claim 2, wherein the fixing section abuts on an end face of the connecting fame near the back plate, and abuts on an end face of the vertical side frame near the back plate.

4. The fixing structure according to claim 3, wherein a sinking groove is formed on both the end face of the connecting fame near the back plate and the end face of the vertical side frame near the back plate, and the fixing section is located in the sinking groove.

5. The fixing structure according to claim 2, wherein the fixing section and the insertion section are integrated into one piece.

6. The fixing structure according to claim 5, wherein the connector is made by bending a plate.

7. The fixing structure according to claim 5, wherein the connector is made of a progressive mold.

8. A display device, comprising the fixing structure according to claim 1.

9. The fixing structure according to claim 3, wherein the fixing section and the insertion section are integrated into one piece.

10. The fixing structure according to claim 4, wherein the fixing section and the insertion section are integrated into one piece.

11. The display device according to claim 8, wherein each of the plurality of said connectors includes a fixing section, a mounting hole is formed on the fixing section, and a fastener for fitting and connecting to the mounting hole is provided on a back plate of the display device.

12. The display device according to claim 11, wherein the fixing section abuts on an end face of the connecting fame near the back plate, and abuts on an end face of the vertical side frame near the back plate.

13. The display device according to claim 12, wherein a sinking groove is formed on both the end face of the connecting fame near the back plate and the end face of the vertical side frame near the back plate, and the fixing section is located in the sinking groove.

14. The display device according to claim 11, wherein the fixing section and the insertion section are integrated into one piece.

* * * * *